United States Patent
Chao et al.

(10) Patent No.: US 9,228,827 B2
(45) Date of Patent: Jan. 5, 2016

(54) FLEXIBLE WAFER LEVELING DESIGN FOR VARIOUS ORIENTATION OF LINE/TRENCH

(71) Applicant: Taiwan Semiconductor Manufacturing Co., Ltd., Hsin-Chu (TW)

(72) Inventors: Kuo-Hung Chao, Hsinchu (TW); Heng-Hsin Liu, New Taipei (TW); Jui-Chun Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 298 days.

(21) Appl. No.: 13/913,584

(22) Filed: Jun. 10, 2013

(65) Prior Publication Data

US 2014/0362359 A1    Dec. 11, 2014

(51) Int. Cl.
  *G03F 7/20* (2006.01)
  *G01B 11/06* (2006.01)
  *G03F 9/00* (2006.01)

(52) U.S. Cl.
  CPC .......... *G01B 11/0608* (2013.01); *G03F 9/7034* (2013.01); *G03F 9/7026* (2013.01)

(58) Field of Classification Search
  CPC .............. G03F 9/7034; G03F 7/70641; G03F 7/70783; G03F 9/7026; G03F 7/7085; G01B 11/0608
  See application file for complete search history.

(56) References Cited

U.S. PATENT DOCUMENTS

| | | | |
|---|---|---|---|
| 5,191,200 A * | 3/1993 | van der Werf et al. | 250/201.4 |
| 5,502,311 A * | 3/1996 | Imai et al. | 250/548 |
| 6,137,561 A * | 10/2000 | Imai | 355/55 |
| 6,674,510 B1 * | 1/2004 | Jasper et al. | 355/55 |
| 7,437,911 B2 | 10/2008 | Galburt et al. | |
| 8,351,024 B2 | 1/2013 | Den Boef | |
| 2008/0036988 A1 | 2/2008 | Teunissen et al. | |
| 2008/0292780 A1* | 11/2008 | Vangheluwe et al. | 427/8 |

* cited by examiner

*Primary Examiner* — Steven H Whitesell Gordon
(74) *Attorney, Agent, or Firm* — Eschweiler & Associates, LLC

(57) ABSTRACT

The present disclosure relates to a photolithography system having an ambulatory projection and/or detection gratings that provide for high quality height measurements without the use of an air gauge. In some embodiments, the photolithography system has a level sensor having a projection source that generates a measurement beam that is provided to a semiconductor substrate via a projection grating. A detector is positioned to receive a measurement beam reflected from the semiconductor substrate via a detection grating. An ambulatory element selectively varies an orientation of the projection grating and/or the detection grating to improve the measurement of the level sensor. By selectively varying an orientation of the projection and/or detection gratings, erroneous measurements of the level sensor can be eliminated.

20 Claims, 4 Drawing Sheets

| | Via field center 1 (more horizontal lines) | Via field center 1 (more vertical lines) |
|---|---|---|
| PDOC | -17 nm | 107 nm |
| Level sensor scan | ⎍⎍⎍ | — |
| Best focus (with air gauge) | -50 nm | -50 nm |
| Best focus (w/o air gauge) | -57 nm | +77 nm |

FLEXIBLE WAFER LEVELING DESIGN FOR VARIOUS ORIENTATION OF LINE/TRENCH

BACKGROUND

The fabrication of integrated circuits on a semiconductor substrate is performed by depositing a plurality of different layers, respectively having different patterns, onto a surface of the semiconductor substrate. The different patterns of the different layers are achieved through the use of photolithography, a process that uses electromagnetic radiation to transfer a geometric pattern from a photomask to a substrate.

In general, a photolithography process is initiated by depositing a layer of photoresist material onto a surface of a semiconductor substrate. The photoresist material is then selectively exposed to electromagnetic radiation (e.g., ultraviolet light), with the exposed areas defined by a photomask. After exposure, the photoresist material is subjected to a developer, which removes unwanted areas of the photoresist material to expose corresponding areas of the underlying semiconductor substrate.

DETAILED DESCRIPTION

Figure 1:
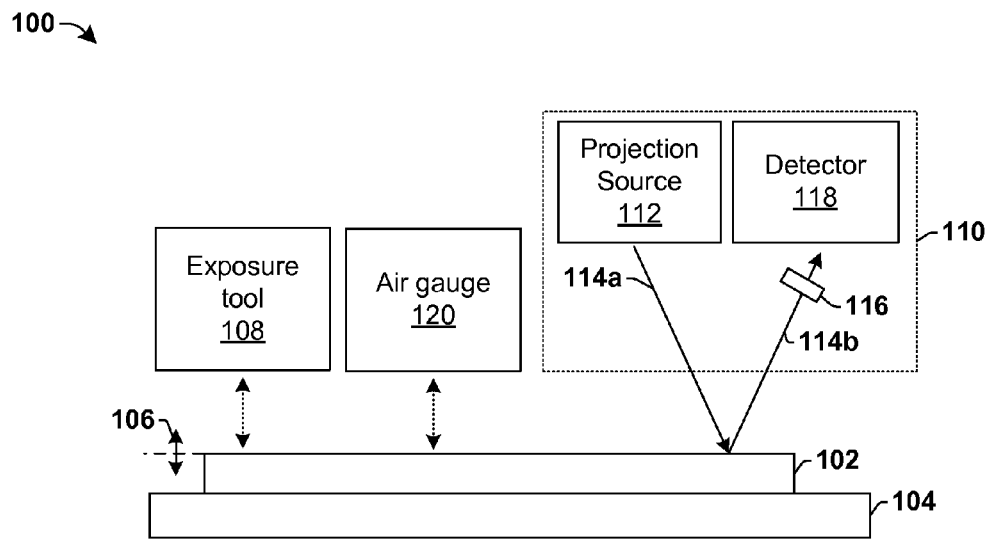
FIG. 1 illustrates a block diagram of some embodiments of a photolithography system.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

FIG. 1 illustrates some embodiments of a block diagram of a photolithography system 100.

The photolithography system 100 comprises a lithographic exposure element 108 configured to selectively expose a semiconductor substrate 102 disposed on a wafer platform 104 to electromagnetic radiation. The surface of the semiconductor substrate 102 that is exposed to electromagnetic radiation may not be flat, but rather may have a topography comprising variations in height 106. The variations in height 106 over the surface of the semiconductor substrate 102 can lead to errors in a projected pattern due to depth of focus errors.

To reduce depth of focus errors, the photolithography system 100 may comprise a level sensor 110 configured to map various heights of the semiconductor substrate 102 before a pattern is projected onto the semiconductor substrate 102. The map may be subsequently used to correct the position of the semiconductor substrate 102 during the projection of a pattern onto the semiconductor substrate 102. The level sensor 110 may comprise a projection source 112 configured to generate a measurement beam 114a and a detector 118 configured to measure an intensity of a reflected measurement beam 114b. A detection grating 116, configured to filter the reflected measurement beam 114b, is positioned between the semiconductor substrate 102 and the detector 118.

It has been appreciated that the level sensor 110 will detect an intensity having a zero amplitude if a line/trench (e.g., a metal line or a trench in which a metal line is formed) on the semiconductor substrate 102 has an orientation that is perpendicular to an orientation of the detection grating 116 (e.g., if a line/trench is horizontal and the detection grating is vertical). To account for such errors in the level sensor 110, the photolithography system 100 may further comprise an air gauge 120 configured to sense a height of the semiconductor substrate 102. The air gauge 120 may comprise a bridge having a measurement nozzle located near the surface of the semiconductor substrate 102 and a reference nozzle. As a gap between the semiconductor substrate 102 and the measurement nozzle changes, the flow rate through the measurement nozzle is altered and a change in differential pressure in the bridge can be detected.

However, the accuracy of a height measurement taken with the air gauge 120 is a function of a time the measurement is taken, thereby resulting in a trade-off between accuracy and measurement time. Accordingly, to achieve a relatively high level of accuracy with the air gauge 120, a relatively high measurement time is required. The high measurement time results in a low throughput, which increases the cost of integrated chip production.

The present disclosure relates to a photolithography system having ambulatory projection and/or detection gratings that provide for high quality height measurements without the use of an air gauge. In some embodiments, the photolithography system comprises a level sensor having a projection source configured to generate a measurement beam that is provided to a semiconductor substrate via a projection grating. A detector is configured to receive a measurement beam reflected from the semiconductor substrate via a detection grating. The detector is configured to measure an intensity of the reflected measurement beam. An ambulatory element is configured to selectively vary an orientation of the projection and/or detection gratings based upon a measured intensity. By selectively varying an orientation of the projection and/or detection gratings, erroneous measurements of the level sensor can be eliminated.

Figure 2:
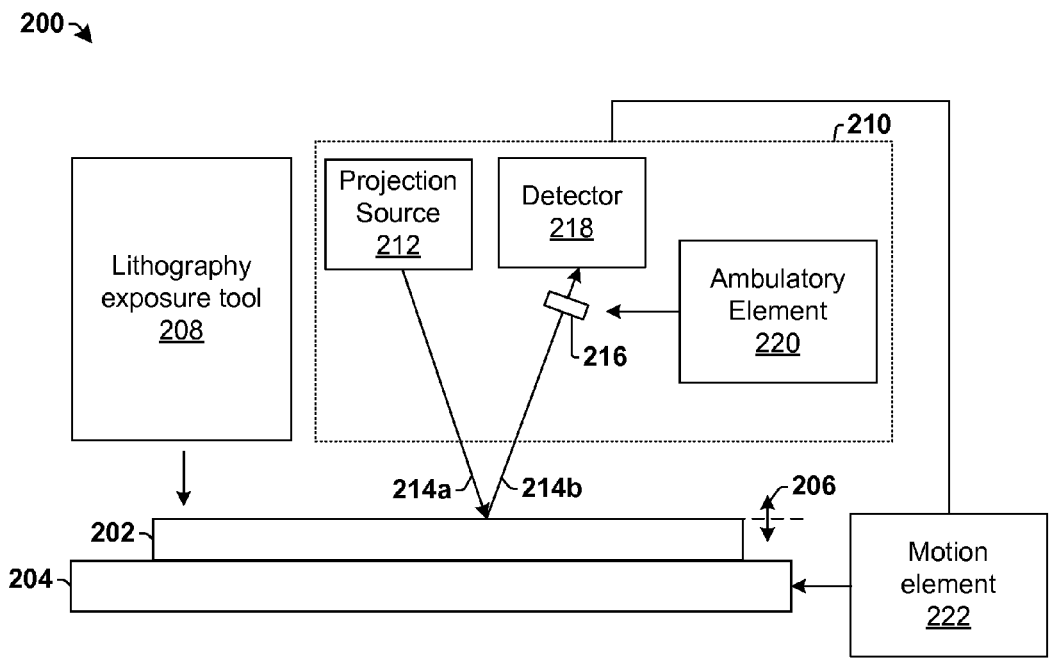
FIG. 2 illustrates some embodiments of a disclosed photolithography system comprising a level sensor with an ambulatory element configured to vary an orientation of a projection and/or detection grating.

FIG. 2 illustrates some embodiments of a disclosed photolithography system 200 comprising a level sensor 210 with an ambulatory element 220 configured to vary an orientation of a detection grating 216.

The photolithography system 200 comprises a lithography exposure element 208 configured to project a pattern onto a semiconductor substrate 202 (e.g., a silicon substrate, a silicon germanium substrate, etc.) disposed onto a wafer platform 204 by exposing the semiconductor substrate 202 to electromagnetic radiation. In some embodiments, the wafer platform 204 may comprise an electrostatic wafer chuck, for example.

The photolithography system 200 further comprises a level sensor 210 configured to measure a height of the semiconductor substrate 202 at different points over a top surface of the semiconductor substrate 202. By measuring a height of the semiconductor substrate 202, variations in height over the top surface of the semiconductor substrate 202 can be determined and the position (i.e., height 206) of the semiconductor substrate 202 can be varied by a motion element 222 to correct for depth of focus errors. In some embodiments, the level sensor 210 comprises a projection source 212 and a detector 218. The projection source 212 is configured to project a measurement beam 214a onto the semiconductor substrate 202. The measurement beam 214a is reflected, as a reflected measurement beam 214b, from a top surface of the semiconductor substrate 202 towards the detector 218, which is configured to detect the intensity of the reflected measurement beam.

A detection grating 216 is located between the semiconductor substrate 202 and the detector 218, at a position that intersects the reflected measurement beam 214b. The detection grating 216 comprises a plurality of segments configured to split the reflected measurement beam 214b into a plurality of reflected measurement beam sections, which are provided to the detector 218. The intensities of the plurality of reflected measurement beam sections indicate a height of the semiconductor substrate 202. For example, in some embodiments, as the height of the semiconductor substrate 202 rises, the intensity of the reflected measurement beam 214b will fall from a maximum to a lesser value. In some embodiments, the detector 218 may comprise a plurality of detectors respectively configured to respectively receive the plurality of reflected measurement beam sections.

An ambulatory element 220 is configured to selectively vary an orientation of the detection grating 216. In some embodiments, the ambulatory element 220 may vary the orientation of the detection grating 216 based upon an intensity of the reflected measurement beam 214b measured by the detector 218. By selectively varying an orientation of the detection grating 216, the ambulatory element 220 may improve a measurement of the level sensor 210 by allowing the detection grating 216 to change orientations when it receives an erroneous reading.

For example, if the detection grating 216 has an orientation that is perpendicular to that of a line/trench in the semiconductor substrate 202, the detector 218 may measure an intensity having a substantially zero amplitude (e.g., since the detection grating will block the reflected measurement beam). In response to the detector 218 measuring an intensity having a substantially zero amplitude, the ambulatory element 220 may rotate the detection grating 216 to have an adjusted orientation that allows for a portion of the reflected measurement beam 214b to pass through the detection grating 216.

Figures 3, 4A:
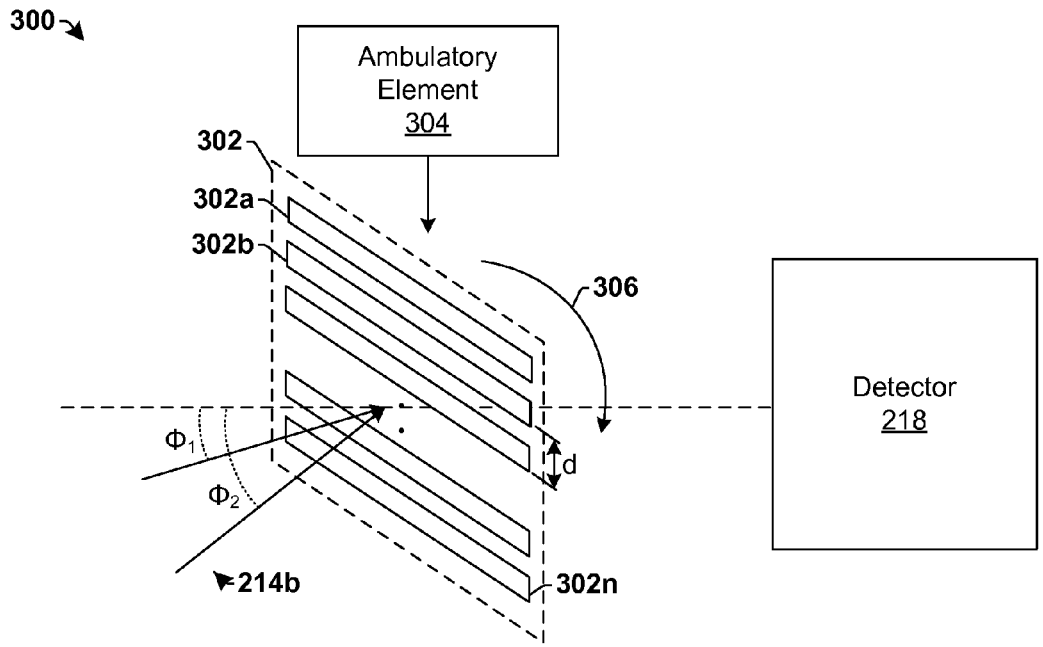
FIG. 3 illustrates some embodiments of a detection grating operated by an ambulatory element.
FIG. 4A is a chart showing some embodiments of a comparison of lithography fields having lines/trenches with varying orientations.

FIG. 3 illustrates some embodiments of photolithography system 300 having a detection grating 302 operated by an ambulatory element 304.

The detection grating 302 comprises a plurality of segments 302a-302n configured to act as a filter on a reflected measurement beam 214b. In some embodiments, the detection grating 302 may comprise a periodic grating with segments 302a-302n having equal widths and equal spacing therebetween. In some embodiments, a sum of the width and spacing of the segments 302a-302b may have a distance d having a range of between approximately 20 microns and approximately 40 microns.

A detector 218 is configured to measure an intensity of the reflected measurement beam. The measured intensity is a function of a height of a semiconductor substrate and of an orientation of lines/trenches (e.g., a metal line or a trench in which a metal line is formed) on the semiconductor substrate. For example, as the height of a semiconductor substrate (e.g., semiconductor substrate 202) varies, the angle of the reflected measurement beam 214b varies. In some embodiments, a first height will provide for a reflected measurement beam having an angle $\phi 1$, while second height, less than the first height, will provide for a reflected measurement beam having an angle $\phi 2$. The detection grating 302 will pass a reflected measurement beam to a detector 218 having an intensity that is a function of the angle of the reflected measurement beam 214b.

Similarly, the orientation of lines/trenches within a semiconductor substrate will provide for a reflected measurement beam 214b having a reflected pattern that is a function of the orientation. For example, lines/trenches having a first orientation (e.g., horizontal) will provide for a reflected measurement beam having a pattern that passes through a detection grating 302 having the first orientation. However, lines/trenches having a second orientation (e.g., vertical) will provide for a reflected measurement beam 214b having a pattern that is substantially blocked by a detection grating 302 having the first orientation.

The ambulatory element 304 is configured to selectively rotate the detection grating 302, as illustrated by arrow 306, to eliminate erroneous intensity measurements due to the orientation of lines/trenches on the semiconductor substrate. Although the ambulatory element 304 is illustrated as rotating the detection grating 302 in a clockwise manner it will be appreciated that the ambulatory element 304 is not limited to such motions, but instead may change the orientation/position of the detection grating 302 in other ways. For example, in some embodiments the ambulatory element 304 may rotate the detection grating in a counter clockwise manner. In other embodiments, the ambulatory element 304 may move the detection grating to a different position.

FIG. 4A is a chart 400 showing some embodiments of a comparison of lithography fields having lines/trenches with varying orientations. Column 402 corresponds to a first lithography field having a topography having more horizontal lines (e.g., with respect to a first level sensor scan direction), while column 404 corresponds to a second lithography field having a topography having more vertical lines (e.g., with respect to the first level sensor scan direction).

As shown in column 402, the optimum focus achievable with the air gauge for the first lithography field is approximately −50 nm, while the optimum focus available without the air gauge for the first lithography field is approximately −57 nm. Therefore, for the first lithography field there is substantially no difference (e.g., 7 nm) between the optimum focus with and without an air gauge. In contrast, as shown in column 404, the optimum focus achievable with the air gauge for the second lithography field is approximately −50 nm, while the optimum focus available without the air gauge for the second lithography field is approximately +77 nm. Therefore, for the second via field there is a difference of 127 nm between the optimum focus with and without an air gauge.

The difference in optimum available focus without the air gauge of the first lithography field (column 402) and the second lithography field (column 404) illustrates that the focus of a photolithography tool is highly a function of the orientation of the lines/trenches on the semiconductor substrate. Since the orientation of the lines/trenches on the semiconductor substrate is relative to the projection and/or detection gratings of the level sensor, by rotating the orientation of a projection and/or detection grating by an angle, level sensor measurements can be improved.

Figure 4B:
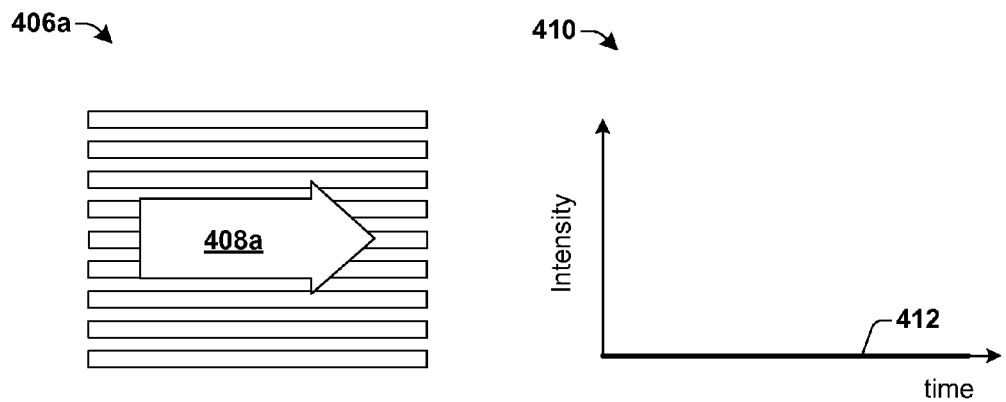
FIGS. 4B-4C illustrate some embodiments of a detection grating of a disclosed level sensor receiving a reflected measurement beam at varying orientations.
Figure 4C:
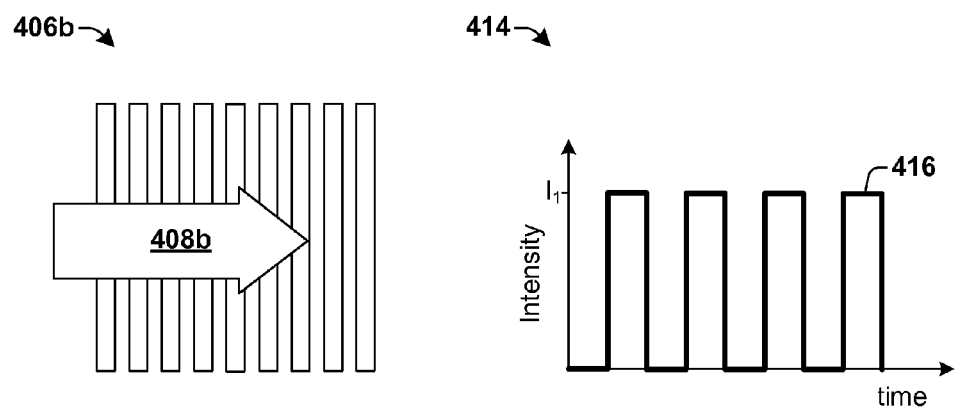

For example, FIGS. 4B-4C illustrate some embodiments of a detection grating 406 of a disclosed level sensor receiving a reflected measurement beam 408 at varying orientations.

FIG. 4B illustrates a detection grating 406a that is positioned to have an orientation that is perpendicular to an orientation of lines/trenches within a semiconductor substrate. Because the detection grating 406a is oriented at a position that is perpendicular to the orientation of the lines/trenches within the semiconductor substrate, a reflected measurement beam 408a will not pass through the detection grating 406a. This behavior is illustrated by graph 410, which shows the intensity of the reflected measurement beam 410a passing through the detection grating 406a as a function of time. As illustrated by trend line 412 in graph 410, the intensity of the reflected measurement beam passing through detection grating 406a is zero.

FIG. 4C illustrates a detection grating 406b that is positioned at an orientation that is not perpendicular (e.g., that is parallel) to an orientation of the lines/trenches in the semiconductor substrate. Because the detection grating 406b is oriented at a position that is not perpendicular to the orientation of lines/trenches within the semiconductor substrate, a reflected measurement beam 408b passes through the detection grating 406b. This behavior is illustrated by graph 414, which shows the intensity of the reflected measurement beam 408b passing through the detection grating 406b as a function of time. As illustrated by trend line 416 in graph 414 the intensity of the reflected measurement beam passing through detection grating 406b varies as a function of time between zero and a first value $I_1$.

Therefore, by changing an orientation of the detection grating 406 from a first orientation (406a) that corresponds to vertical lines/trenches to a second orientation (406b) that corresponds to horizontal lines/trenches, the level sensor can be adjusted to improve the measurement capabilities of the level sensor.

Figure 5:
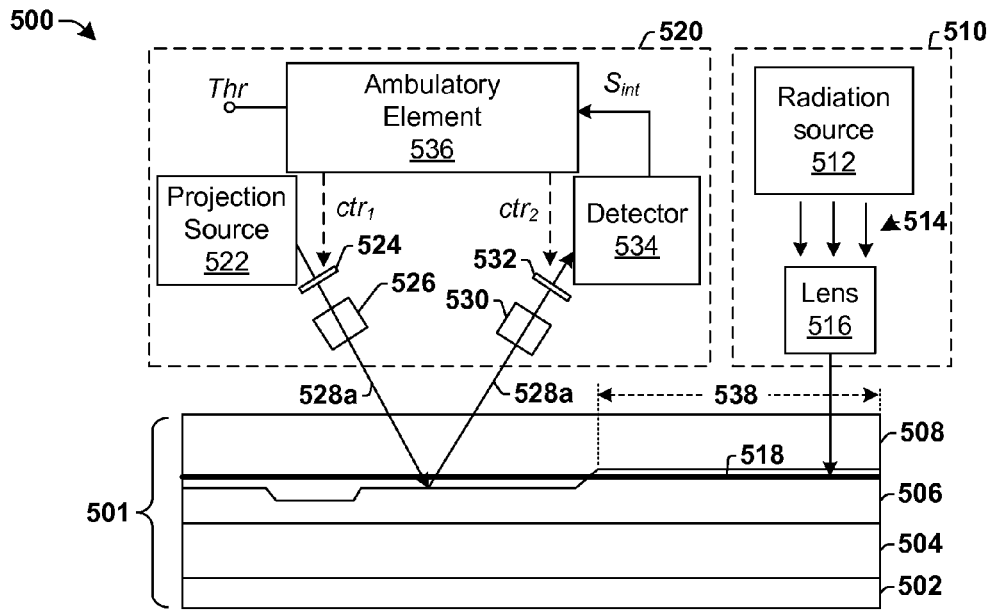
FIG. 5 illustrates an additional embodiment of a disclosed photolithography system having a level sensor with ambulatory projection and/or detection gratings.

FIG. 5 illustrates an additional embodiment of a disclosed photolithography system 500 having a level sensor 520 with an ambulatory element 536.

The photolithography system 500 comprises a semiconductor substrate 501. The semiconductor substrate 501 comprises a semiconductor body 502. A dielectric material 504 is located over the semiconductor body 502. In some embodiments, the dielectric material 504 may comprise silicon dioxide ($SiO_2$). A bottom antireflective coating (BARC) layer 506, used to improve critical dimension (CD) control during photolithographic processes, may be located over the dielectric material 504. A photoresist layer 508 is disposed on the BARC layer 506.

A lithographic exposure element 510 is configured to generate electromagnetic radiation that is used to selectively expose the photoresist layer 508. The lithographic exposure element 510 comprises a radiation source 512 configured to generate electromagnetic radiation 514 used in exposing the photoresist layer 508. In various embodiments, the radiation 514 may comprise ultraviolet radiation, deep ultraviolet radiation, extreme ultraviolet radiation, or x-ray radiation, for example. The radiation 514 is provided to a lens 516 that is configured to focus the radiation 514 onto an optimum exposure plane 518 in the photoresist layer 508. In some embodiments, the photolithography system 500 may comprise an immersion lithography tool, wherein a liquid (not shown) is positioned between the lens 516 and the semiconductor substrate 501.

The photolithography system 500 further comprises a level sensor 520. The level sensor 520 may be configured to measure a height of the BARC layer 506. The level sensor 520 comprises a projection source 522, a detector 534, and ambulatory element 536. The projection source 522 is configured to generate a measurement beam 528a that is provided to a first level sensor lens 526 configured to focus the measurement beam 528a onto a top surface of the BARC layer 506. In some embodiments, an ambulatory projection grating 524 may be positioned between the projection source 522 and the first level sensor lens 526. The BARC layer 506 reflects the measurement beam 528a as a reflected measurement beam 528b, which is provided to a second level sensor lens 530, which focuses the reflected measurement beam 528b to a detection grating 532. A detector 534 is configured to measure an intensity $S_{int}$ of the reflected measurement beam 528b that passes through the detection grating 532.

The intensity $S_{int}$ of the reflected measurement beam 528b is provided to an ambulatory element 536. The ambulatory element 536 is configured to compare the intensity $S_{int}$ to a threshold value $S_{th}$. If the intensity $S_{int}$ does not violate the threshold value $S_{th}$, the ambulatory element 536 takes no action. However, if the intensity $S_{int}$ violates the threshold value $S_{th}$ (e.g., if the detected illumination level is less than the threshold value) the ambulatory element 536 varies an orientation of the projection grating 524 and/or the detection grating 532 to improve the measurement of the level sensor 520. In some embodiments, the ambulatory element 536 is configured to adjust the orientation of the projection grating 524 and the detection grating 532 to have a same orientation.

By measuring the height of the BARC layer 506 over the semiconductor substrate 501, the photolithography system 500 can determine whether the lithographic exposure element 510 focusing on the optimum exposure plane 518 or if the topography of the semiconductor substrate 501 prevents the lithographic exposure element 510 from focusing on the optimum exposure plane 518. For example, in region 538 the topography of the semiconductor substrate 501 is such that the BARC layer 506 has a height that is greater than the optimum exposure plane 518. By operating the level sensor 520 to measure the height of the BARC layer 506 in region 538, the vertical position of the semiconductor substrate 501 can changed to a position that accounts for the topography of the semiconductor substrate 501 so that the lithographic exposure element 510 may focus on the optimum exposure plane 518.

Figure 6:
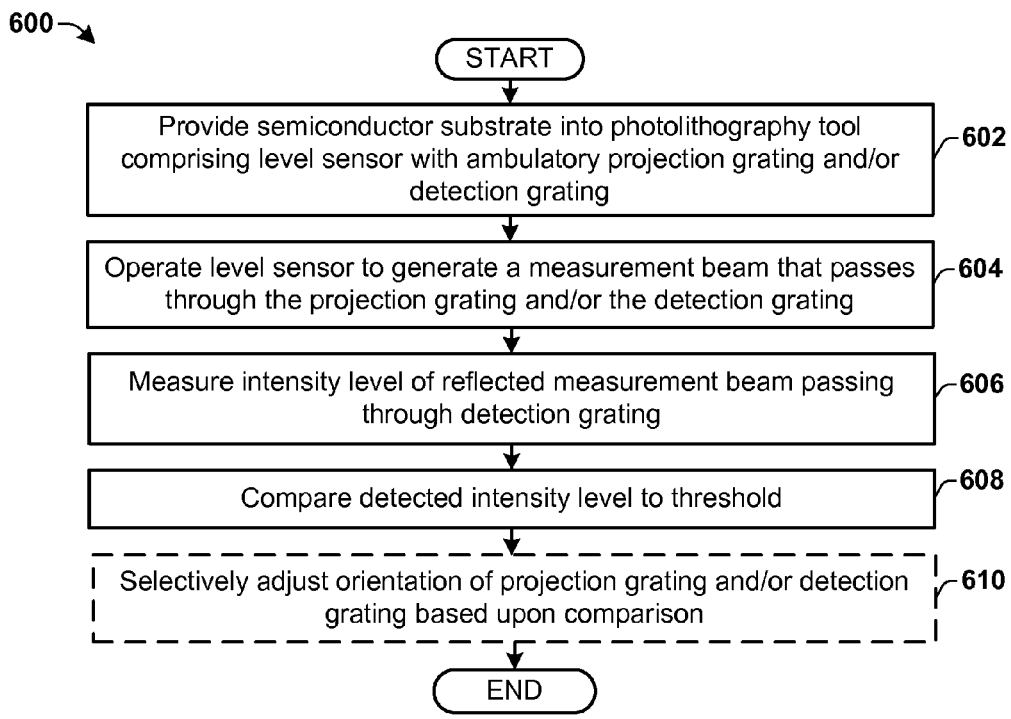
FIG. 6 illustrates a flow chart of some embodiments of a method of determining a height of a substrate for a photolithography process.

FIG. 6 illustrates a flow chart of some embodiments of a method 600 of determining a height of a substrate for a photolithography process.

While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a semiconductor substrate is provided into a photolithography tool with ambulatory projection and/or detection gratings. In various embodiments, the semiconductor substrate may comprise a silicon substrate, a silicon germanium substrate, a germanium substrate, etc. The substrate may additionally comprise additional layers overlying the substrate, such as epitaxial layers, dielectric layers, metallization layers, etc. The photolithography tool may comprise an ultraviolet, deep ultraviolet, extreme ultraviolet, or x-ray lithography source. In some embodiments, the photolithography tool may comprise an immersion lithography tool, for example.

At 604, a level sensor is operated to generate a measurement beam along a path that passes through the projection grating and/or the detection grating. The measurement beam will pass through the projection grating as it propagates from a projection source to the semiconductor substrate, and after being reflected off of the semiconductor substrate, the reflected measurement beam will pass through the detection grating.

At 606, an intensity level of the reflected measurement beam passing through the detection grating is measured. In some embodiments, the intensity level may comprise the intensity of different measurement beam sections that are passed through openings in the detection grating.

At 608, the detected intensity level is compared to a threshold value. If the detected intensity level does not violate the threshold value, method 600 ends. However, if the detected intensity level violates the threshold value (e.g., if the detected intensity level is less than the threshold value) the method proceeds to 610.

At 610, the orientation of the projection grating and/or the detection grating is selectively adjusted based upon the comparison. For example, if the detected intensity level violates a threshold value, to indicate that a signal having a substantially zero intensity is received, the orientation of the projection grating and/or the detection grating may be rotated to a different orientation to increase a value of the intensity.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a photolithography system having a level sensor comprising ambulatory projection and/or detection gratings that provide for high quality height measurements without the use of an air gauge.

In some embodiments, the present disclosure relates to a photolithography system, comprising a lithographic exposure element configured to selectively expose a semiconductor substrate to electromagnetic radiation. A level sensor is configured to measure a height of a semiconductor substrate at different points over a top surface of the semiconductor substrate. The level sensor comprises a projection source configured to generate a measurement beam that is provided to a semiconductor substrate via a projection grating, a detector configured to receive a measurement beam that is reflected off of a semiconductor substrate via a detection grating and to measure an intensity of the reflected measurement beam corresponding to a height of the semiconductor substrate, and an ambulatory element configured to selectively adjust an orientation of detection grating or the projection grating.

In other embodiments, the present disclosure relates to a level sensor configured to measure a height of a semiconductor substrate at different points over a top surface of the semiconductor substrate. The level sensor comprises a projection source configured to generate a measurement beam that is reflected off of a semiconductor substrate. The level sensor further comprises a detector configured to receive the measurement beam reflected off of the semiconductor substrate and to measure an intensity of the reflected measurement beam corresponding to a height of the semiconductor substrate. The level sensor further comprises a detection grating positioned between the semiconductor substrate and the detector. The level sensor further comprises an ambulatory element configured to selectively rotate the detection grating.

In other embodiments, the present disclosure relates to a method of determining a height of a substrate for a photolithography process. The method comprises providing a semiconductor substrate into a photolithography tool with an ambulatory projection grating or an ambulatory detection grating. The method further comprises operating a level sensor to generate a measurement beam along a path that passes through the projection grating or the detection grating. The method further comprises measuring an intensity level of the reflected measurement beam passing through the detection grating. The method further comprises selectively adjusting an orientation of the projection grating or the detection grating based upon the detected intensity level.

What is claimed is:

1. A photolithography system, comprising:
   a lithographic exposure element configured to selectively expose a semiconductor substrate to electromagnetic radiation;
   a level sensor configured to measure a height of a semiconductor substrate at different points over a top surface of the semiconductor substrate, comprising:
   a projection source configured to generate a measurement beam that is provided to a semiconductor substrate via a projection grating;
   a detector configured to receive a measurement beam that is reflected off of the semiconductor substrate via a detection grating and to measure an intensity of the measurement beam corresponding to a height of the semiconductor substrate; and
   an ambulatory element configured to selectively adjust an orientation of the detection grating or the projection grating, wherein the ambulatory element is configured to compare the intensity of the measurement beam to a threshold value and to adjust an orientation of the detection grating or the projection grating if the intensity violates the threshold value.

2. The photolithography system of claim 1, wherein the ambulatory element is configured to adjust an orientation of the detection grating or the projection grating to match an orientation of lines on the semiconductor substrate.

3. The photolithography system of claim 1, wherein the ambulatory element is configured to adjust the orientation of the projection grating and the detection grating to have a same orientation.

4. The photolithography system of claim 3, wherein the electromagnetic radiation comprises extreme ultraviolet electromagnetic radiation.

5. The photolithography system of claim 1,
wherein the projection grating is positioned between the projection source and a first level sensing lens; and
wherein the detection grating is positioned between a second level sensing lens and the detector.

6. The photolithography system of claim 1,
wherein the semiconductor substrate comprises a photoresist layer overlying a bottom antireflective coating (BARC) layer; and
wherein the level sensor is configured to measure a height of the BARC layer at different points over a top surface of the semiconductor substrate.

7. The photolithography system of claim 1, wherein the detection grating comprises a plurality of segments configured to act as a filter on a received reflected measurement beam.

8. The photolithography system of claim 7, wherein a sum of a width and spacing of the plurality of segments is equal to a range of between 20 microns and 40 microns.

9. A level sensor configured to measure a height of a semiconductor substrate at different points over a top surface of the semiconductor substrate, comprising:
a projection source configured to generate a measurement beam that is reflected off of a semiconductor substrate;
a detector configured to receive the measurement beam reflected off of the semiconductor substrate and to measure an intensity of the measurement beam;
a detection grating positioned between the semiconductor substrate and the detector;
a projection grating positioned between the projection source and the semiconductor substrate; and
an ambulatory element-configured to selectively rotate the detection grating or the projection grating if the intensity violates a threshold value.

10. The level sensor of claim 9,
wherein the projection grating is configured to filter the measurement beam output from the projection source.

11. The level sensor of claim 10, wherein the ambulatory element is configured to compare the intensity to the threshold value.

12. The level sensor of claim 10, wherein the ambulatory element is configured to adjust an orientation of the detection grating or the projection grating to match an orientation of lines on the semiconductor substrate.

13. The level sensor of claim 10,
wherein the projection grating is positioned between the projection source and a first level sensing lens; and
wherein the detection grating is positioned between a second level sensing lens and the detector.

14. The level sensor of claim 10, wherein the detection grating comprises a plurality of segments configured to act as a filter on a received reflected measurement beam.

15. The level sensor of claim 14, wherein a sum of a width and spacing of the plurality of segments is equal to a range of between 20 microns and 40 microns.

16. The level sensor of claim 9, further comprising:
a motion element configured to receive a correction signal from the detector and to selectively adjust a position of the semiconductor substrate based upon the correction signal.

17. The level sensor of claim 9, wherein the ambulatory element is further configured to move the detection grating to a different position if the intensity violates the threshold value.

18. A method of determining a height of a semiconductor substrate for a photolithography process, comprising:
providing a semiconductor substrate into a photolithography tool with an ambulatory projection grating or an ambulatory detection grating;
operating a level sensor to generate a measurement beam along a path that passes through the projection grating or the detection grating;
measuring an intensity level of the measurement beam passing through the detection grating;
selectively adjusting an orientation of the projection grating or the detection grating based upon the intensity level; and
comparing the intensity level to a threshold value, wherein if the intensity level violates the threshold value the orientation of the projection grating or the detection grating is adjusted.

19. The method of claim 18, wherein adjusting the orientation of the projection grating or the detection grating comprises rotating an angle of the projection grating or the detection grating to match an orientation of lines on the semiconductor substrate.

20. The method of claim 19, wherein adjusting the orientation of the projection grating or the detection grating comprises adjusting the orientation of the projection grating and the detection grating to have a same orientation.

* * * * *